(12) United States Patent  
Aoki et al.

(10) Patent No.: US 10,840,202 B2  
(45) Date of Patent: *Nov. 17, 2020

(54) METHOD OF FORMING SOLDER BUMPS

(71) Applicant: INTERNATIONAL BUSINESS MACHINES CORPORATION, Armonk, NY (US)

(72) Inventors: Toyohiro Aoki, Kawasaki (JP); Takashi Hisada, Kawasaki (JP); Hiroyuki Mori, Kawasaki (JP); Eiji Nakamura, Kawasaki (JP); Yasumitsu Orii, Kawasaki (JP)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 114 days.

This patent is subject to a terminal disclaimer.

(21) Appl. No.: 15/714,146

(22) Filed: Sep. 25, 2017

(65) Prior Publication Data

US 2018/0076165 A1 Mar. 15, 2018

Related U.S. Application Data

(62) Division of application No. 15/264,964, filed on Sep. 14, 2016, now Pat. No. 10,115,692.

(51) Int. Cl.
*H01L 23/00* (2006.01)
*H01L 21/48* (2006.01)

(52) U.S. Cl.
CPC .......... *H01L 24/14* (2013.01); *H01L 21/4867* (2013.01); *H01L 24/00* (2013.01);
(Continued)

(58) Field of Classification Search
CPC ... H01L 2224/0401; H01L 2224/05082; H01L 2224/1112; H01L 2224/11462;
(Continued)

(56) References Cited

U.S. PATENT DOCUMENTS 5,673,846 A * 10/1997 Gruber ............... B23K 35/0222  
164/113  
2002/0113324 A1* 8/2002 Cordes ............... H01L 21/4857  
257/784

(Continued)

FOREIGN PATENT DOCUMENTS

| JP | 2000286555 A | 10/2000 |
| JP | 2002198649 A | 7/2002 |
| JP | 2005259845 A | 9/2005 |

OTHER PUBLICATIONS

List of IBM Patents or Patent Applications Treated as Related dated Apr. 17, 2018, 2 pages.

(Continued)

*Primary Examiner* — Duy T Nguyen

(74) *Attorney, Agent, or Firm* — Tutunjian & Bitetto, P.C.; Randall Bluestone

(57) ABSTRACT

A method of forming solder bumps includes preparing a substrate having a surface on which a plurality of electrode pads are formed, forming a resist layer on the substrate, the resist layer having a plurality of openings, each of the openings being aligned with a corresponding electrode pad of the plurality of electrode pads, forming a conductive pillar in each of the openings of the resist layer, forming conductive layers to cover at least side walls of the resist layer in the openings to block gas emanating from the resist layer, filling molten solder in each of the openings in which the conductive layers has been formed and removing the resist layer.

20 Claims, 7 Drawing Sheets

(52) U.S. Cl.
CPC .............. *H01L 24/03* (2013.01); *H01L 24/05*
(2013.01); *H01L 24/06* (2013.01); *H01L 24/11*
(2013.01); *H01L 24/13* (2013.01); *H01L 24/27*
(2013.01); *H01L 24/30* (2013.01); *H01L
24/742* (2013.01); *H01L 2224/03009*
(2013.01); *H01L 2224/03019* (2013.01); *H01L
2224/0345* (2013.01); *H01L 2224/0361*
(2013.01); *H01L 2224/03452* (2013.01); *H01L
2224/03505* (2013.01); *H01L 2224/0401*
(2013.01); *H01L 2224/05082* (2013.01); *H01L
2224/1112* (2013.01); *H01L 2224/1132*
(2013.01); *H01L 2224/1145* (2013.01); *H01L
2224/1147* (2013.01); *H01L 2224/11452*
(2013.01); *H01L 2224/11462* (2013.01); *H01L
2224/11464* (2013.01); *H01L 2224/13076*
(2013.01); *H01L 2224/13082* (2013.01); *H01L
2224/13083* (2013.01); *H01L 2224/29139*
(2013.01); *H01L 2224/29144* (2013.01); *H01L
2224/29147* (2013.01); *H01L 2224/29155*
(2013.01); *H01L 2224/29164* (2013.01); *H01L
2224/3001* (2013.01); *H01L 2224/73104*
(2013.01); *H01L 2224/94* (2013.01); *H01L
2924/01028* (2013.01); *H01L 2924/01029*
(2013.01); *H01L 2924/01046* (2013.01); *H01L
2924/01047* (2013.01); *H01L 2924/01079*
(2013.01)

(58) Field of Classification Search
CPC . H01L 2224/29139; H01L 2224/29144; H01L
2224/29147; H01L 2224/29155; H01L
2224/29164; H01L 2224/3001; H01L
2224/73104; H01L 24/03; H01L 24/05;
H01L 24/06; H01L 24/11; H01L 24/14;
H01L 24/27; H01L 24/30; H01L 24/742;
H01L 2924/01028; H01L 2924/01029;
H01L 2924/01046; H01L 2924/01047;
H01L 2924/01079; H01L 24/00; H01L
24/13; H01L 21/4867; H01L 2224/1147
USPC ........................................................ 438/584
See application file for complete search history.

(56) References Cited

U.S. PATENT DOCUMENTS

| | | | |
|---|---|---|---|
| 2002/0175438 A1* | 11/2002 | Gruber | H01L 21/486 264/102 |
| 2008/0169539 A1 | 7/2008 | Fang et al. | |
| 2010/0044084 A1* | 2/2010 | Lee | H01L 21/4853 174/257 |
| 2010/0230696 A1 | 9/2010 | Fukunaga | |
| 2011/0193220 A1 | 8/2011 | Kuo et al. | |
| 2011/0278716 A1* | 11/2011 | Hsu | H01L 24/11 257/737 |
| 2012/0305633 A1* | 12/2012 | Feger | B23K 1/0016 228/203 |
| 2013/0313687 A1 | 11/2013 | Bonkohara et al. | |
| 2013/0313707 A1* | 11/2013 | Choi | H01L 24/12 257/738 |
| 2014/0182912 A1 | 7/2014 | Lin et al. | |
| 2014/0217580 A1 | 8/2014 | Myung et al. | |
| 2014/0361431 A1 | 12/2014 | Matsumoto et al. | |
| 2015/0171039 A1 | 6/2015 | Cheng et al. | |
| 2015/0279755 A1 | 10/2015 | Gooch et al. | |
| 2015/0329353 A1 | 11/2015 | Cheng et al. | |

OTHER PUBLICATIONS

Office Action with cited art in corresponding U.S. Appl. No. 15/498,735 dated Jun. 21, 2019, 14 pages.
U.S. Office Action issued in U.S. Appl. No. 15/498,735 dated Oct. 11, 2018, 13 pages.
U.S. Office Action issued in U.S. Appl. No. 15/498,735 dated Feb. 26, 2019, 13 pages.
U.S. Office Action issued in U.S. Appl. No. 15/498,735 dated Oct. 24, 2019, 13 pages.
U.S. Office Action issued in U.S. Appl. No. 15/498,735 dated Feb. 5, 2020, 13 pages.
List of IBM Patents or Patent Applications Treated as Related dated Sep. 25, 2017, 2 pages.
Office Action from U.S. Appl. No. 15/498,735 dated Jul. 3, 2017, pp. 1-11.

* cited by examiner

METHOD OF FORMING SOLDER BUMPS

BACKGROUND OF THE INVENTION

Technical Field

The present invention generally relates to a method of forming solder bumps, and more specifically, to a method of forming solder bumps using injection of molten solder.

Description of the Related Art

While performance and function of electronics devices improve highly, flip chip packaging is broadly applied from the consumer product represented by a smart phone, tablet PC, etc. to the supercomputer. Furthermore, it is predicted that the demand of flip chip packaging increases sharply by the appearance of the 2.5 or 3-dimensional (2.5D or 3D) stacked device of the semiconductor chip.

In the 2.5D or 3D package, connecting terminals pitch and bump size is dramatically fine. In that case, there is a problem of failure due to stress applied to the junction or failure due to electro migration (EM) caused by the increase of current density. To solve this problem, the solder bumps using Cu pillars corresponding to the miniaturization of the connecting terminals pitch and bump size is mainly used.

As a method of forming solder on Cu pillars, Injection Molded Solder (IMS) method has been developed. In IMS method, molten solder is directly injected into openings of a resist mask at higher temperature than solder melting point. In the process, the degree of vacuum in the opening of the resist mask is reduced and contamination of the electrode surface is generated by gas which is generated from the resist mask. As a result, the solder is not filled sufficiently in the opening or the solder does not wet and spread to the electrode pads.

One of the solutions is to develop a resist material which has low outgas at high temperature, but it is difficult to eliminate outgas completely because the resist should be strippable after IMS. As an IMS process, a solution is to increase the injection pressure. However, by increasing the injection pressure, there is a possibility that solder leakage occurs. To suppress solder leakage, it is necessary to increase the pressing pressure of the IMS head, in which case, there is a possibility of deforming the resist material.

Thus, in the conventional method of forming fine solder bumps using IMS, it is not easy to make uniform and low defect solder bumps. Therefore, there is a need of method to form fine solder bumps with high uniform and low defects.

SUMMARY

The present invention provides a method of forming solder bumps on the substrate using injection of molten solder such as IMS. In the method, conductive layers which cover at least side walls of the resist layer in the openings is formed before injecting solder to block gas emanating from the resist layer. The conductive layers can include at least a metal with solder wettability and/or higher melting point than materials of the molten solder. In the process, the substrate temperature can be controlled to a temperature lower than the melting point of the conductive layers to prevent the deposited layers from melting and aggregating.

The conductive layers suppress the invasion of outgas of the resist opening. Suppressing the invasion of outgas of the resist opening by the conductive layers maintains the degree of vacuum in the openings and inhibits the contamination of the electrode surfaces on the substrate. Since the conductive layers with solder wettability on the surfaces in the openings are present, they make it easier to solder injection into the openings at a lower pressure in IMS process. Accordingly, in comparison with no metal layer, high solder filling rate is achieved at a low solder injection pressure, and the risk of solder leakage is reduced. Since the conductive layers dissolve into the molten solder in IMS process, it is possible to expose the resist surface and allow subsequent resist removal (etching).

DETAILED DESCRIPTION

Figure 1:
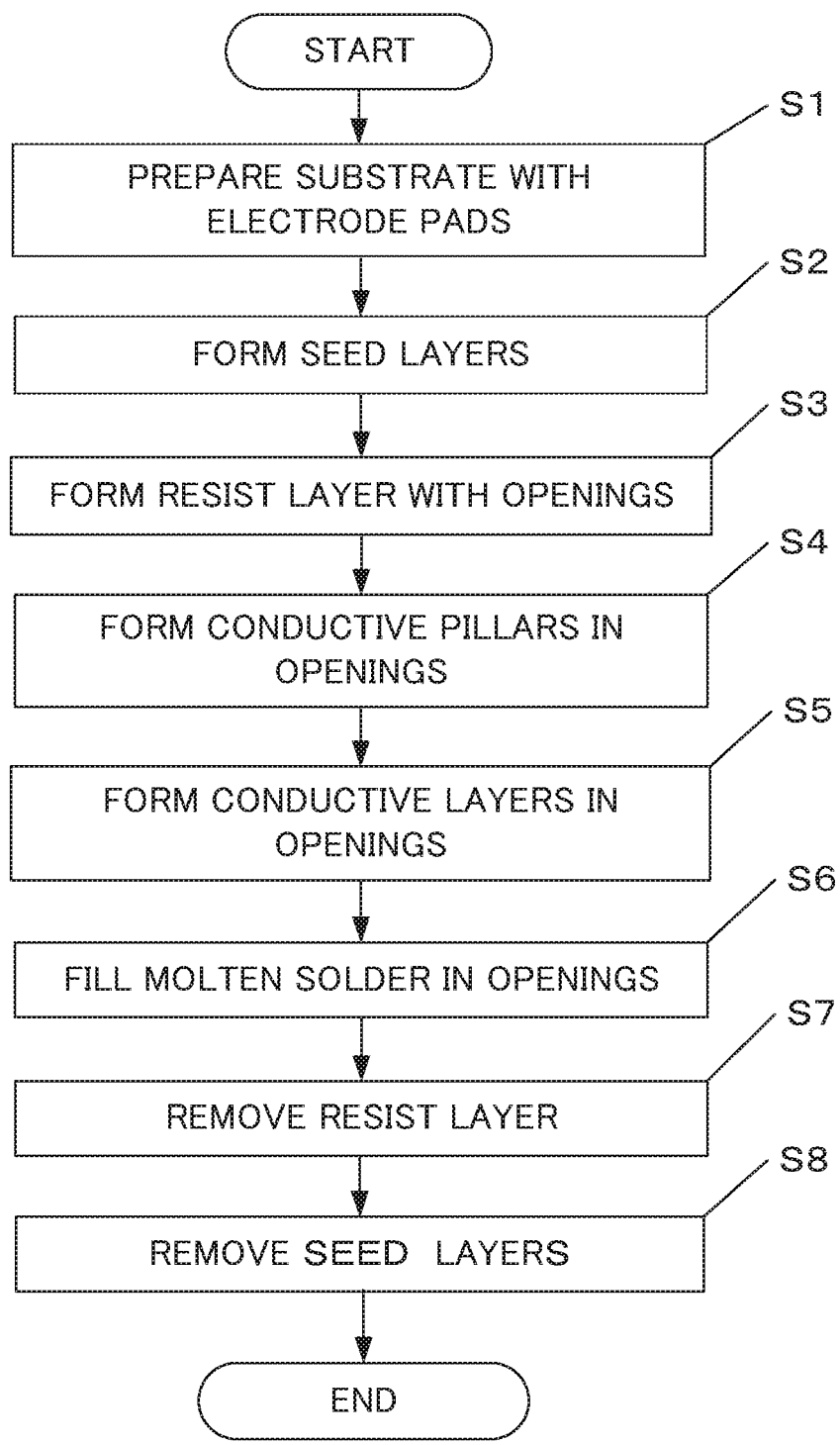
FIG. 1 is a blow/flow diagram showing a system/method of forming solder bumps in accordance with one embodiment of the present invention.
Figure 11:
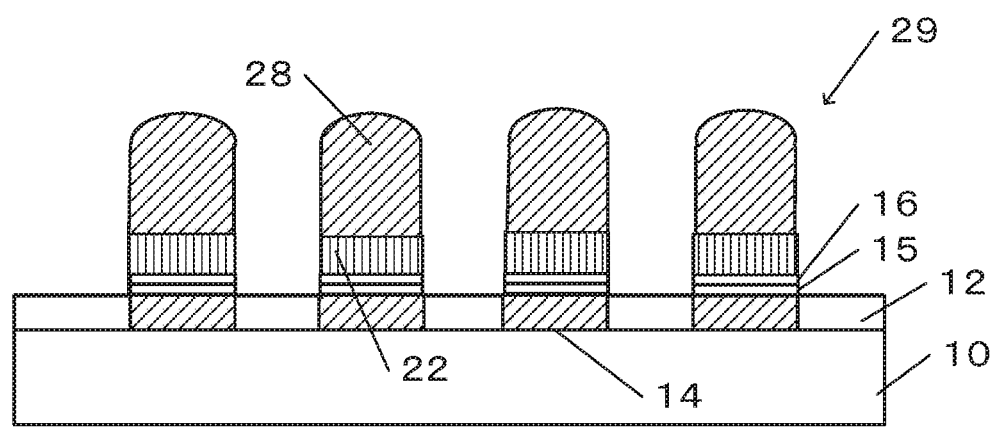
FIG. 11 is a cross-sectional diagram showing a solder bump structure in accordance with one embodiment of the present invention.
Figure 12:
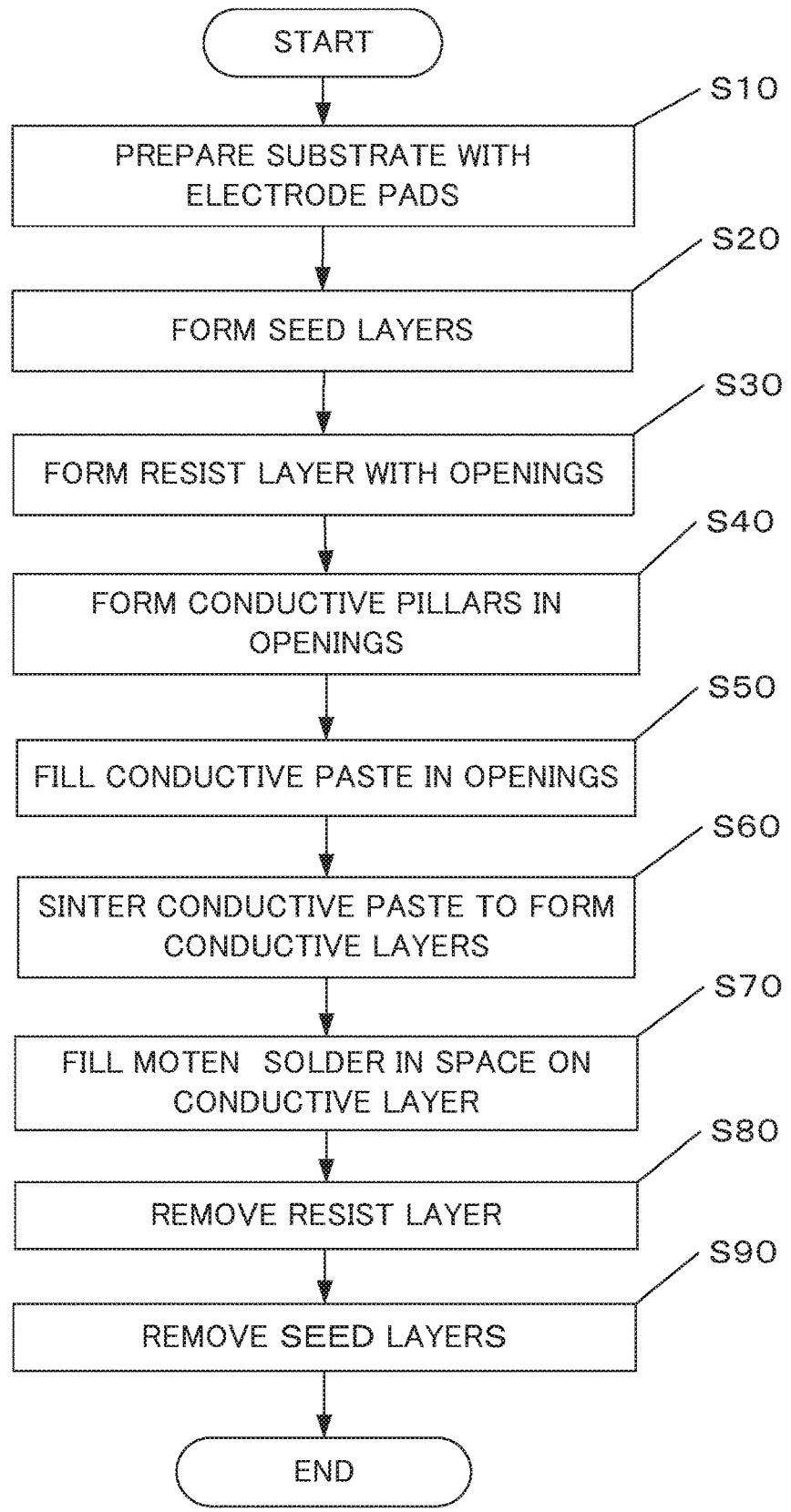
FIG. 12 is a block/flow diagram showing a system/method of forming solder bumps in accordance with an embodiment of the present invention.

The following description is an explanation of embodiments of the present invention with reference to the drawings. FIG. 1 is a block/flow diagram showing a system/method of forming solder bumps in accordance with an embodiment of the present invention. Each of FIG. 2 to FIG. 11 shows cross-sectional diagram of a solder bump structure at each step in the flowchart of FIG. 1. FIG. 12 is a block/flow diagram showing a system/method of forming solder bumps in accordance with an embodiment of the present invention. FIG. 13 to FIG. 17 show cross-sectional diagrams of a solder bump structure at steps selected from the flowchart of FIG. 12. Each of the cross-sectional diagrams shows a part of a substrate. The following description is an explanation of the embodiments of the present invention with reference to FIG. 1 to FIG. 17.

Embodiment 1

Figure 2:
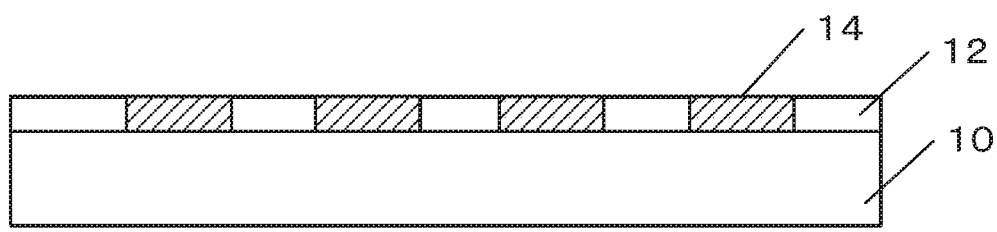
FIG. 2 is a cross-sectional diagram showing a solder bump structure in accordance with one embodiment of the present invention.

Referring FIG. 2, in step S1 of FIG. 1, a substrate 10 is prepared first. The substrate 10 has a surface on which electrode pads 14 are formed between patterned insulating layers 12. The electrode pads 14 can include metal, such as aluminum (Al), for example. The insulating layers 12 can include silicon oxide (SiO$_2$), for example. The substrate 10 can include semiconductor wafer, such as a Si wafer, a semiconductor chip/die, or a circuit board. The material of the semiconductor wafer or chip is not limited to specific types. The substrate 10 can include a plurality of wiring layers (including circuits, devices such as a transistor) and insulating layers. The wiring layers can electrically connect to the electrode pads 14. The substrate 10 may include a lamination (e.g., stack) of a plurality of semiconductor substrates.

Figure 3:
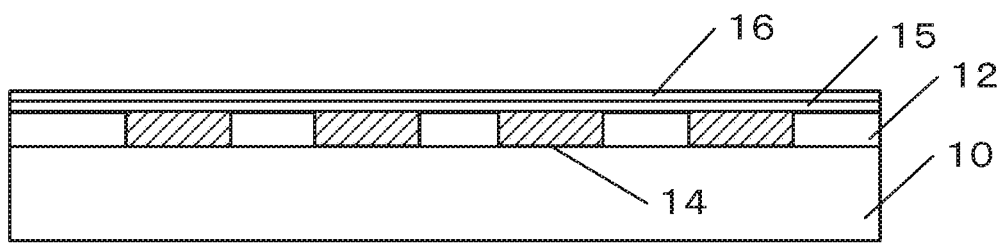
FIG. 3 is a cross-sectional diagram showing a solder bump structure in accordance with one embodiment of the present invention.

Referring to FIG. 3, in step S2 of FIG. 1, at least one seed layer 15, 16 is formed on the substrate 10. The at least one seed layer 15, 16 is used when using electro plating to form conductive pillars 22 in the later step S4. If not using electro plating to form the conductive pillars 22, it is not necessary to form the seed layer 15, 16. The seed layers 15, 16 may include a plurality of conductive layers. The conductive layers may include a first conductive layer 15, and a second conductive layer 16 on the first conductive layer 15, as shown in FIG. 3. The first conductive layer 15 may include Ti or TiW, for example. The second conductive layer 16 may include Cu, for example. The seed layers 15, 16 may be formed by a conventional thin-film formation technique such as sputtering or plasma CVD, for example.

Figure 4:
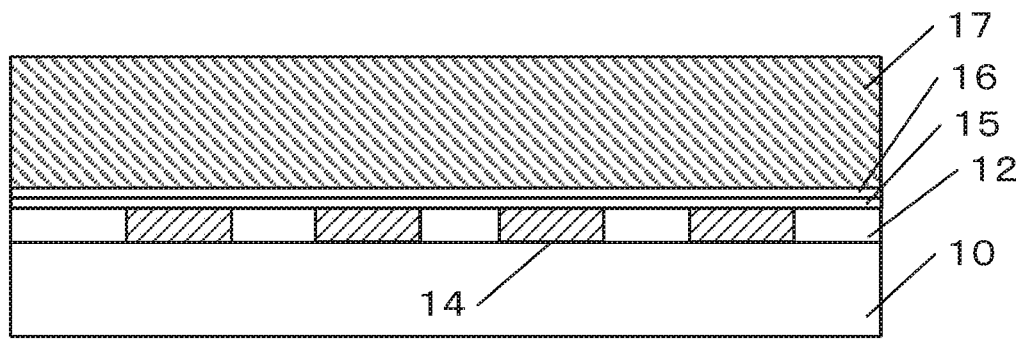
FIG. 4 is a cross-sectional diagram showing a solder bump structure in accordance with one embodiment of the present invention.

Referring FIG. 4, in step S3 of FIG. 1, a resist layer 17 is formed on the substrate 10. A resist material is applied on the substrate 10 using spin coating for example, and the resist material is cured at a predetermined temperature to form the resist layer 17. The resist material may include light (UV)-curable resin (photopolymer) or thermosetting resin (polymer). The resist layer 17 may include one of negative tone type resist or positive tone type resist.

Figure 5:
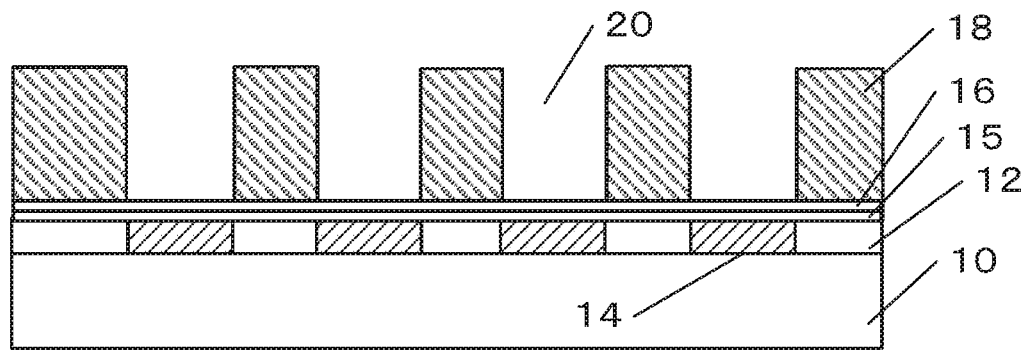
FIG. 5 is a cross-sectional diagram showing a solder bump structure in accordance with one embodiment of the present invention.

Next, the resist layer 17 is exposed using light induced through a photo mask (not shown) in FIG. 4. For example, if the resist layer 17 is negative tone type, the exposure is performed to expose only the resist region over the insulating layers 12 without exposing the resist region over the electrode pads 14. Next, the exposed resist layer 17 is developed and patterned to form resist layer 18 with openings 20 over the electrode pads 14, as shown in FIG. 5. Each of the openings 20 exposes the surface of the top seed layer 16 over the electrode pads 14 on the substrate 10. When the surface of the seed layer 16 is easily oxidized, it is necessary to remove the oxide layer formed on the surface before the next step. The oxide layer can be removed by etching using an acidic solution, for example.

Figure 6:
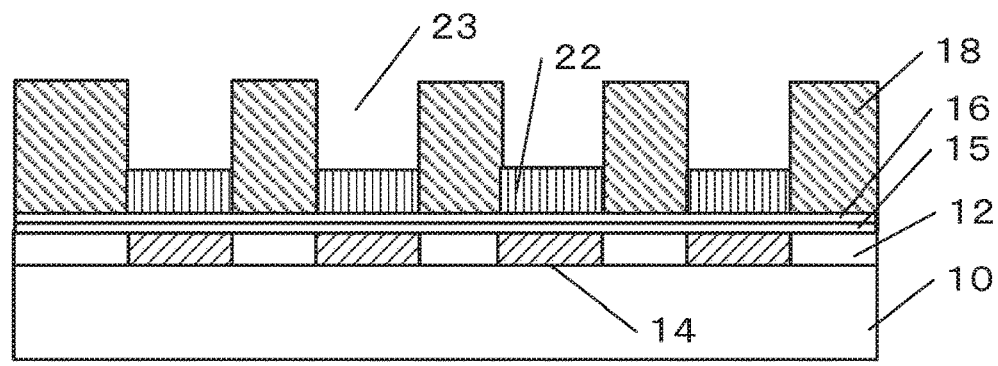
FIG. 6 is a cross-sectional diagram showing a solder bump structure in accordance with one embodiment of the present invention.

Next, in step S4 of FIG. 1, conductive pillars 22 are formed in the openings 20 to connect to the electrode pads 14 via the seed layers 15, 16, as shown in FIG. 6. The conductive pillars 22 may be formed by electroplating conductive material in the openings 20 of the resist layer 18 to leave space (e.g., a cavity) 23 with a predetermined depth on the conductive pillar 22 in the openings 20. The conductive material may include Cu, for example. The conductive pillar 22 can also be formed before step S3. The conductive pillar 22 can be formed by other conventional metal formation technique such as electro-less plating, sputtering or plasma CVD, for example.

Figure 7:
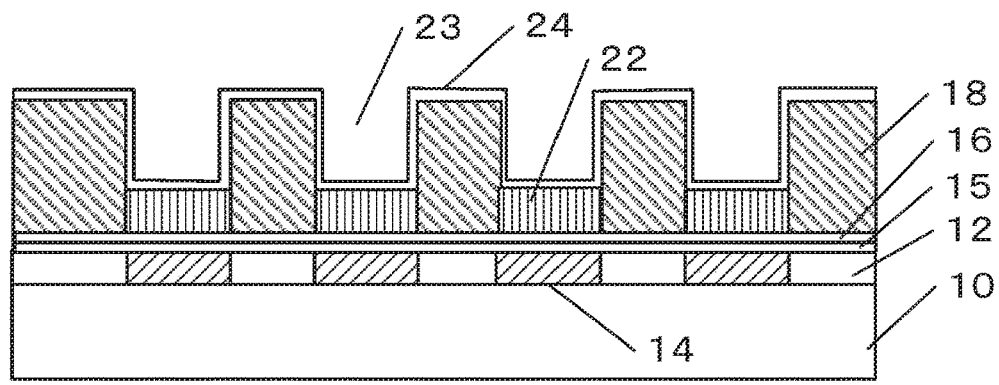
FIG. 7 is a cross-sectional diagram showing a solder bump structure in accordance with one embodiment of the present invention.

Next, in step S5 of FIG. 1, a conductive layer 24 is formed on the substrate as shown in FIG. 7. In FIG. 7, the conductive layer 24 is a continuous layer and covers the surfaces of the conductive pillars 22 and surfaces of the resist layer 18. The conductive layer 24 may be formed by conventional metal formation technique, such as vacuum deposition, sputtering, electroless plating or plasma CVD, for example. The conductive layer 24 is used to block gas emanating from the resist layer 18 in the next solder injection process. The conductive layer 24 may include at least a metal with solder wettability and/or higher melting point than materials of the molten solder which is used in the next solder injection process. The conductive layer 24 may include at least one of metals selected from the group comprising Sn, Au, Ag, Cu, Pd, Pt and In.

Figure 8:
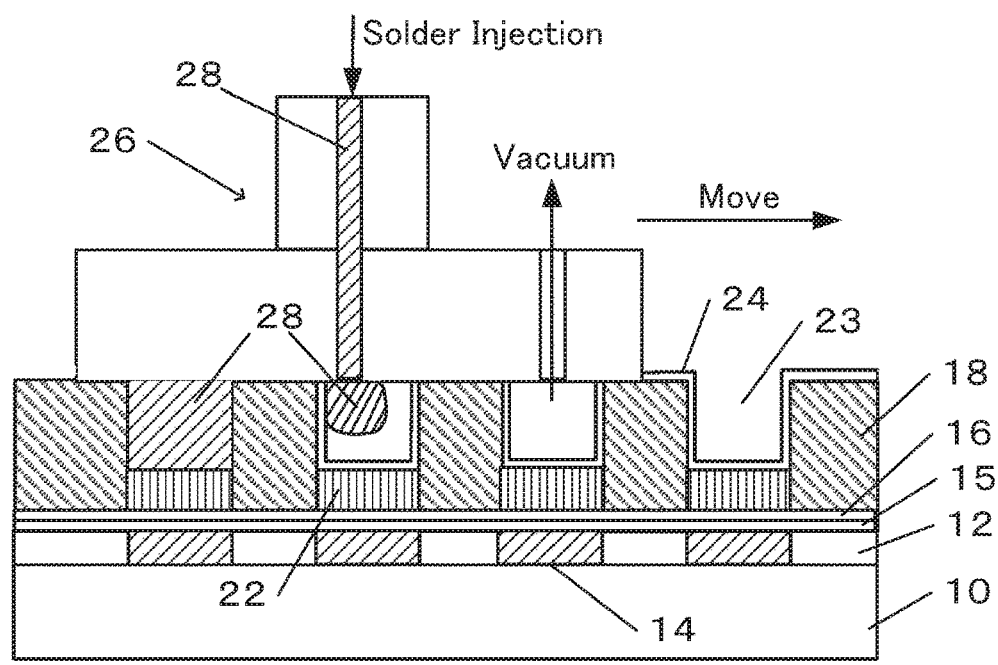
FIG. 8 is a cross-sectional diagram showing a solder bump structure in accordance with one embodiment of the present invention.
Figure 9:
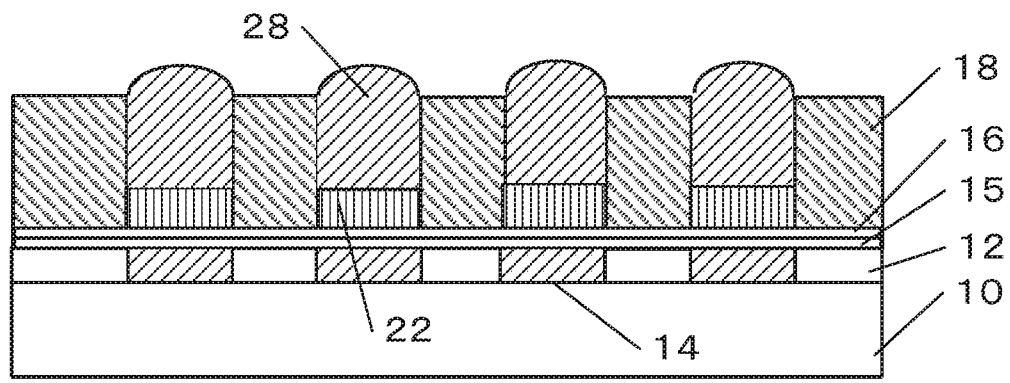
FIG. 9 is a cross-sectional diagram showing a solder bump structure in accordance with one embodiment of the present invention.

Next, in step S6 of FIG. 1, molten solder 28 is filled in the space 23 on the conductive pillar 22 as shown in FIG. 8 and FIG. 9. The molten solder 28 is injected in the space 23 on the conductive layer 24 using Injection Molded Solder (IMS) process, for example, as shown in FIG. 8. In the IMS process, the space 23 is first vacuumed and the molten solder 28 is injected in the space 23 which has been vacuumed under the predetermined temperature and pressure by the IMS head 26. The predetermined temperature is set as the predetermined substrate temperature and controlled to a temperature lower than the melting point of the conductive layer 24 in the IMS process. The peak of the substrate temperature, in other words, the substrate temperature when the IMS head 26 passes on the opening 23 which has been vacuumed is controlled above the melting point of the solder.

The predetermined pressure for the injection is determined according to the materials of the tip of the IMS head 26. For example, the tip material of the IMS head 26 includes silicone sponge and low friction sheet, the pressure is set to 0.02-0.2 MPa as the differential pressure between the atmospheric pressure, depending on size of openings. The IMS head 26 repeats evacuation and solder injection while moving in the horizontal direction in FIG. 8.

In the injection of molten solder, the conductive layer 24 blocks gas emanating from the resist layer 18 and maintains the degree of vacuum in the space 23, inhibiting the contamination of the conductive pillars 22 on the substrate 10. The conductive layer 24 is dissolved in the molten solder 28 with high temperature to be injected. As a result, the conductive layer 24 loses its form of layers after the solder injection as shown in FIG. 9. Since the conductive layer 24 dissolves into the molten solder 28 in IMS process, it is possible to expose the resist surface and allow subsequent resist removal (etching) without additional process of etching the conductive layer 24.

Since the conductive layer 24 with solder wettability on the surfaces in the space 23 are present, they make it easier to solder injection into the spaces 23 at a lower pressure in IMS process. Accordingly, in comparison with no conductive layer, high solder filling rate is achieved at the low solder injection pressure, and the risk of solder leakage is reduced. The molten solder 28 may include a Pb-free solder metal containing at least one metal selected from the group consisting of elemental Sn, Ag, Au, Cu, Ni, Bi, In, Zn, Co, Ge, Fe and Ti, and containing Sn or In as a main component. The injected molten solder 28 is cooled and has a shape with convex top surface, as shown in FIG. 9.

Figure 10:
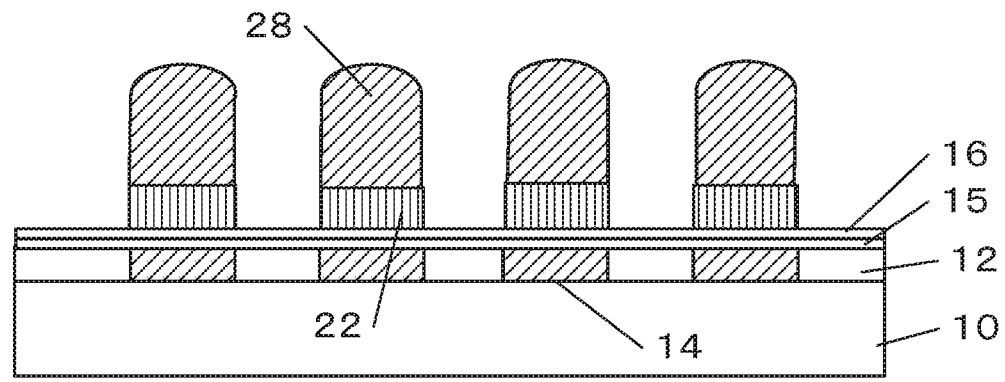
FIG. 10 is a cross-sectional diagram showing a solder bump structure in accordance with one embodiment of the present invention.

Next, in step S7 of FIG. 1, the resist layer 18 is removed using conventional etching process and the surface of the seed layer 16 is exposed as shown in FIG. 10. Finally, in step S8 of FIG. 1, the seed layers 15, 16 on the insulating layer 12 is removed using conventional etching method and the solder bumps 29 is obtained, as shown in FIG. 11. Each of the solder bumps 29 includes the solder 28 on the conductive pillar 22 connected to the electrode pad 14 via the seed layers 15, 16 on the substrate 10.

Embodiment 2

Figure 13:
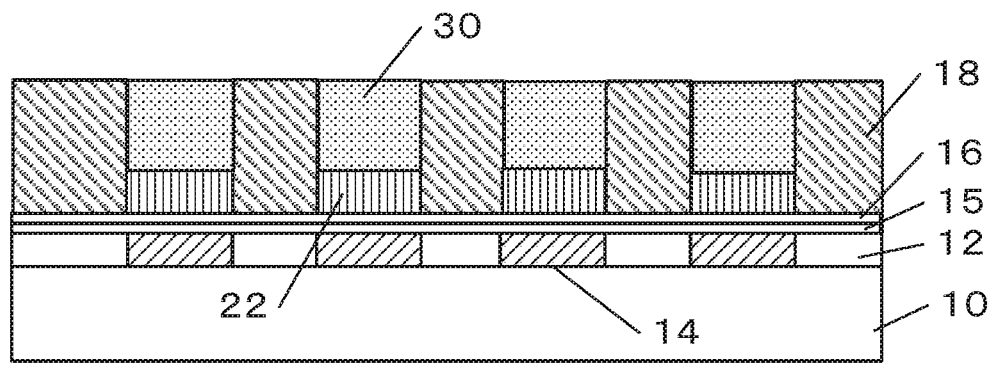
FIG. 13 is a cross-sectional diagram showing a solder bump structure in accordance with an embodiment of the present invention.

Referring FIG. 12 to FIG. 17, an embodiment of the present invention is described. Steps S10 to S40, and S70 to S90 in FIG. 12 are the same as steps S1 to S4, and S6 to S8 in FIG. 1 respectively, as described above. Steps S50 and S60 are added in FIG. 12. In step S50 of FIG. 12, conductive paste is filled in the space 23 on the conductive pillar 22 in FIG. 6. FIG. 13 shows a cross-sectional diagram of a solder bump structure after step S50, which performs filling the conductive paste 30 in the space 23. The conductive paste 30 can be filled in the space 23 of the resist layer 18 using screen-printing technique or injecting technique, for example. The conductive paste 30 can include metal nanoparticles in a solvent. The metal nanoparticles may include at least a metal with solder wettability and higher melting point than materials of the molten solder 28 which is used in the later solder injection process. The metal nanoparticles may include at least one of metals selected from the group comprising Sn, Au, Ag, Cu, Pd, Pt, Ni and In, for example. The viscosity of the conductive paste 30 and the particle fraction in the conductive paste 30 may be determined in consideration of paste shrinkage, in other words, the thickness of a conductive layer to be obtained by the next sintering process.

Figure 14:
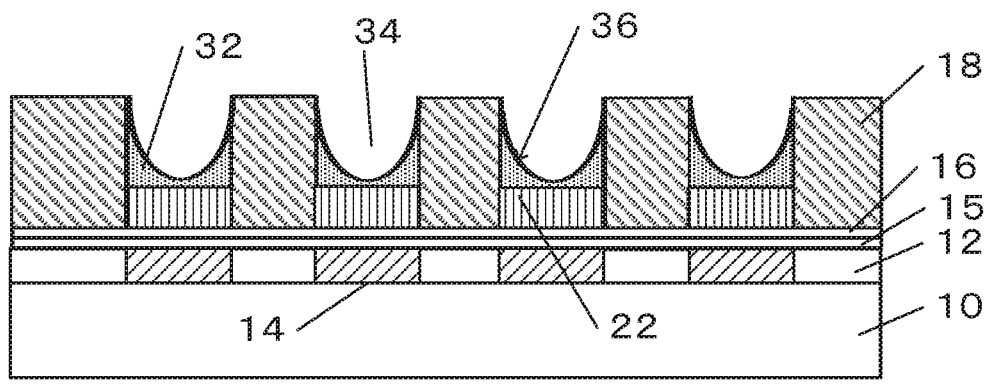
FIG. 14 is a cross-sectional diagram showing a solder bump structure in accordance with an embodiment of the present invention.

Next, in step S60 of FIG. 12, the conductive paste 30 in the spaces 23 is sintered to form a thin conductive layer 32. The sintering of the conductive paste 30 in the opening is performed to heat the conductive paste 30 at 150 to 250 degrees Celsius for 0.5 to 1.5 hours in an atmosphere of nitrogen gas or formic acid to prevent oxidation of the metal surface after the sintering. If the sintering is performed in air, it is necessary to remove the oxide layer on the metal surface. In the sintering process, the conductive paste 30 shrinks so that the thin conductive layers 32 are formed as shown in FIG. 14. The thin conductive layers 32 cover the inner side walls of the resist layer 18 and the surface of the conductive pillars 22, as shown in FIG. 14. The thin conductive layers 32 are only formed in the space 23 (34) without covering the top surfaces of the resist layer 18. The thin conductive layers 32 are used to block gas emanating from the resist layer 18 in the next solder injection process, as in the case of the conductive layers 24 in FIG. 8.

As solder filling is performed in the next step without additional conductive paste coating, the volume shrinkage of the conductive paste 22 after sintering is optimized. The volume shrinkage of the conductive paste 22 is dependent on the design value of the bump diameter/height, and for example is preferably at least 50% or more. In other words, the thickness of the conductive layers 32 after the sintering is set as the thickness required to block outgas from the resist layers 18 in the next soldering process. The space 34 is formed on the conductive layer 32 which leads to the upper end of the opening 20. The conductive layer 32 has a cone-shaped surface 36, as shown in FIG. 14. The cross-section of the conductive layer 32 has a conformal shape.

Figure 15:
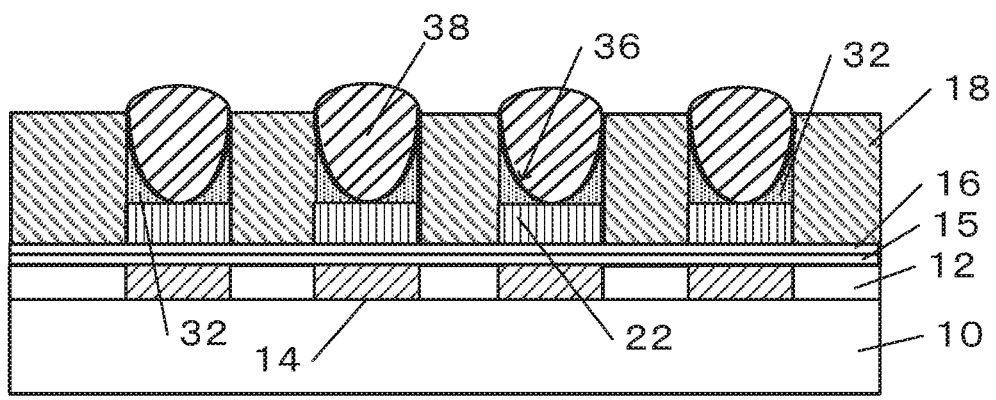
FIG. 15 is a cross-sectional diagram showing a solder bump structure in accordance with an embodiment of the present invention.

Next, in step S70 of FIG. 12, molten solder 38 is filled in the space 34 on the conductive pillar 22 as shown in FIG. 15. The injected molten solder 38 is cooled and has a shape with convex top surface as shown in FIG. 15. The molten solder 38 is in contact with and extends an entire length of the cone-shaped surface of the conductive layer 32. The molten solder 38 is injected in the space 34 on the conductive layer 32 using IMS process, for example, as in the case of the molten solder 28 in FIG. 8. As described above referring FIGS. 8 and 9, in the IMS process, the space 34 is first vacuumed and the molten solder 38 is injected in the space 34 which has been vacuumed under the predetermined temperature by the IMS head 26 in FIG. 8. The IMS head 26 repeats evacuation and solder injection while moving in the horizontal direction in FIG. 8. In the injection of molten solder 38, the conductive layers 32 block gas emanating from the resist layer 18 and maintain the degree of vacuum in the space 34, inhibiting the contamination of the conductive pillars 22 on the substrate 10.

Each conductive layer 32 is dissolved in the molten solder 38 with high temperature to be injected. As a result, at least part of each conductive layer 32 loses its form as a layer after the solder injection as shown in FIG. 15. Since the top surfaces of the resist layers 18 remain exposed in the soldering process, it is possible to allow subsequent resist removal (etching) without additional process of etching the conductive layers 32.

Figure 16:
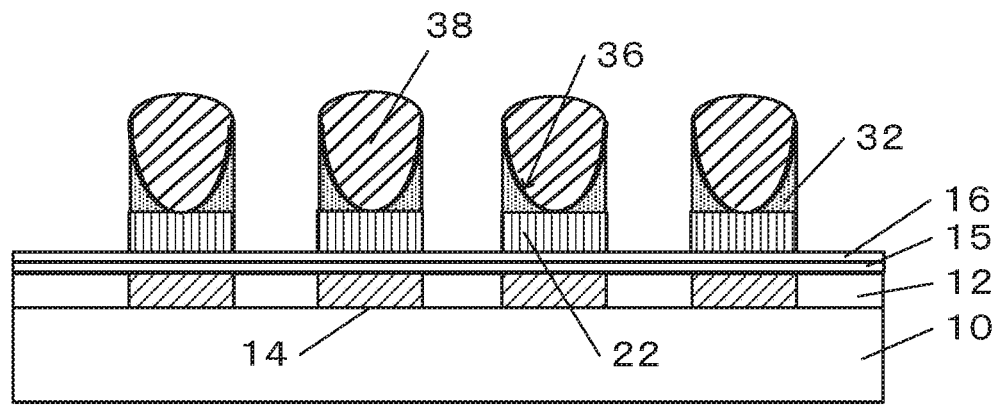
FIG. 16 is a cross-sectional diagram showing a solder bump structure in accordance with an embodiment of the present invention.
Figure 17:
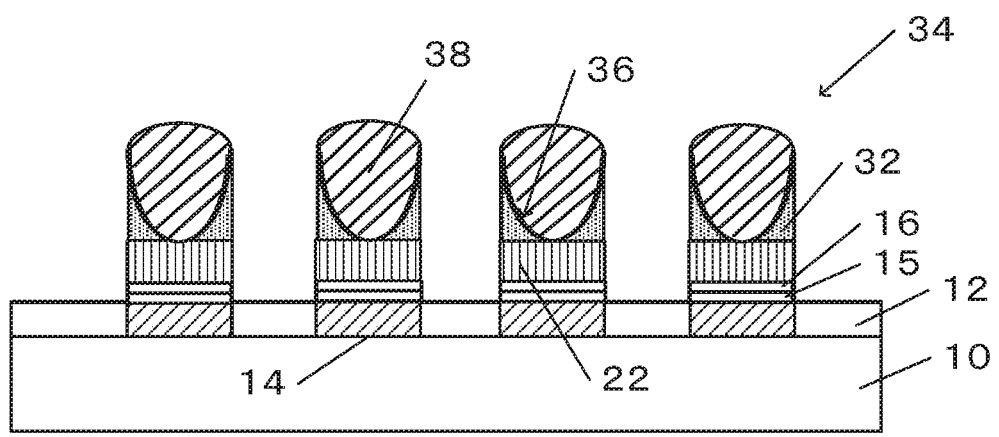
FIG. 17 is a cross-sectional diagram showing a solder bump structure in accordance with an embodiment of the present invention.

Next, in step S80 of FIG. 12, the resist layer 18 is removed using a conventional etching process and the surface of the seed layer 16 is exposed as shown in FIG. 16. In step S90 of FIG. 12, the seed layers 15, 16 on the insulating layer 12 is removed using conventional etching method and the solder bumps 34 of an embodiment of the present invention is obtained, as shown in FIG. 17. Each of the solder bumps 34 includes the solder 38 on the conductive pillar 22 connected to the electrode pad 14 via the seed layers 15, 16 on the substrate 10.

Embodiment 3

Referring FIG. 12 to FIG. 15, an embodiment of the present invention is described. In an embodiment, the filling of the conductive paste 30 in step S50 of FIG. 12 is performed using IMS process which is used in step S70 of filling of molten solder 38 instead of screen printing. In step S50, the conductive paste 30 is injected in place of molten solder 38 under predetermined pressure by IMS process. By using the IMS in Step S50, it is possible to perform steps S50 to S70 under one IMS process. That is, sintering of step S60 can be performed in the IMS process. As a result, it is possible to achieve a further shortening of the production time and simplification of the manufacturing process to form the solder bumps 34.

Embodiment 4

Referring FIG. 1 and FIG. 7, an embodiment of the present invention is described. In an embodiment, the conductive layer 24 is formed as two or more layers on the on the substrate 10 to cover the surfaces of the conductive pillars 22 and surfaces of the resist layer 18. In this case, it is possible to form layers made of different conductive materials. For example, a first conductive layer having melting point higher than that of the solder 28 is formed and a second conductive layer having good solder wettability is formed on the first conductive layer. In the IMS process of step S6 in FIG. 1, FIG. 8, the predetermined substrate temperature is set to a temperature lower than the melting point of the first conductive layer.

Embodiment 5

Referring FIG. 1 and FIG. 7, an embodiment of the present invention is described. In an embodiment, the conductive layer 24 is formed by conductive metals having the same composition ratio as the composition ratio of metals of the molten solder 28 in order to maintain the composition ratio of the solder after the IMS process. For example, if the composition ratio of the molten solder 28 used by IMS process is Sn (96.5 wt %)/Ag (3.0 wt %)/Cu (0.5 wt %), the conductive layer 24 can include the same composition ratio of Sn (96.5 wt %)/Ag (3.0 wt %)/Cu (0.5 wt %).

The embodiments of the present invention have been described with reference to the accompanying drawings. However, the present invention is not limited to the embodiment. The present invention can be carried out in forms to which various improvements, corrections, and modifications are added based on the knowledge of those skilled in the art without departing from the purpose of the present invention.

What is claimed is:

1. A method of forming solder bumps, the method includes:
    preparing a substrate having a surface on which a plurality of electrode pads are formed;
    forming a resist layer on the substrate, the resist layer having a plurality of openings, each of the openings being aligned with a corresponding electrode pad of the plurality of electrode pads;
    forming a conductive pillar in each of the openings of the resist layer;
    forming conductive layers, including two or more metal layers, to cover at least side walls of the resist layer in the openings, the conductive layers being configured to block gases emanating from the resist layer as a result of outgassing;
    filling molten solder in a vacuum formed in each of the openings in which the conductive layers has been formed, wherein the conductive layers have a higher melting point than materials of the molten solder; and
    removing the resist layer.

2. The method according to claim 1, wherein filling the molten solder in the vacuum formed in each of the openings includes injecting the molten solder in each of the openings under predetermined injecting pressure and predetermined substrate temperature.

3. The method according to claim 2, wherein injecting the molten solder in each of the openings is performed using an Injection Molded Solder (IMS) method.

4. The method according to claim 2, wherein the predetermined substrate temperature is lower than melting points of metals constituting the conductive layers.

5. The method according to claim 1, wherein the conductive layers include at least a metal with solder wettability/higher melting point than materials of the molten solder.

6. The method according to claim 1, wherein the conductive layers include at least one metal selected from the group comprising Sn, Au, Ag, Cu, Pd, Pt, and In.

7. The method according to claim 1, wherein the conductive layers include metals having a same composition ratio as a composition ratio of metals of the molten solder.

8. The method according to claim 1, further comprising:
    forming at least one seed layer on the substrate before forming the resist layer; and
    removing the at least one seed layer after removing the resist layer.

9. The method according to claim 1, wherein forming the conductive pillar in each of the openings of the resist layer includes electroplating conductive material in the opening of the resist layer.

10. The method according to claim 1, wherein the electrode pads are formed between patterned insulating layers.

11. A method of forming solder bumps, the method includes:
    preparing a substrate having a surface on which a plurality of electrode pads are formed;
    forming a resist layer on the substrate, the resist layer having a plurality of openings, each of the openings being aligned with a corresponding electrode pad of the plurality of electrode pads;
    forming a conductive pillar in each of the openings of the resist layer;
    forming conductive layers, including forming the conductive layers using vapor deposition, sputtering, or electroless plating, to cover at least side walls of the resist layer in the openings, the conductive layers being configured to block gases emanating from the resist layer as a result of outgassing;
    filling molten solder in a vacuum formed in each of the openings in which the conductive layers has been formed; and
    removing the resist layer.

12. The method according to claim 11, wherein filling the molten solder in the vacuum formed in each of the openings includes injecting the molten solder in each of the openings under predetermined injecting pressure and predetermined substrate temperature.

13. The method according to claim 12, wherein injecting the molten solder in each of the openings is performed using an Injection Molded Solder (IMS) method.

14. The method according to claim 12, wherein the predetermined substrate temperature is lower than melting points of metals constituting the conductive layers.

15. The method according to claim 11, wherein the conductive layers include at least a metal with solder wettability/higher melting point than materials of the molten solder.

16. The method according to claim 11, wherein the conductive layers include at least one metal selected from the group comprising Sn, Au, Ag, Cu, Pd, Pt, and In.

17. The method according to claim 11, wherein the conductive layers include metals having a same composition ratio as a composition ratio of metals of the molten solder.

18. The method according to claim 11, wherein the conductive layers include two or more metal layers.

19. The method according to claim 11, further comprising:
    forming at least one seed layer on the substrate before forming the resist layer; and
    removing the at least one seed layer after removing the resist layer.

20. The method according to claim 19, wherein forming the conductive pillar in each of the openings of the resist layer includes electroplating conductive material in the opening of the resist layer.

* * * * *